(12) United States Patent
Warrick et al.

(10) Patent No.: US 10,586,865 B2
(45) Date of Patent: Mar. 10, 2020

(54) DUAL GATE METAL-OXIDE-SEMICONDUCTOR FIELD-EFFECT TRANSISTOR

(71) Applicant: Cirrus Logic International Semiconductor Ltd., Edinburgh (GB)

(72) Inventors: Scott Warrick, Austin, TX (US);
Justin Dougherty, Austin, TX (US);
Alexander Barr, Austin, TX (US);
Christian Larsen, Austin, TX (US);
Marc L. Tarabbia, Austin, TX (US);
Ying Ying, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 68 days.

(21) Appl. No.: 15/720,977

(22) Filed: Sep. 29, 2017

(65) Prior Publication Data

US 2019/0103490 A1 Apr. 4, 2019

(51) Int. Cl.
| | | |
|---|---|---|
| *H01L 29/78* | (2006.01) | |
| *H01L 29/40* | (2006.01) | |
| *H01L 29/786* | (2006.01) | |
| *H01L 29/06* | (2006.01) | |
| *H01L 21/761* | (2006.01) | |
| *H01L 21/762* | (2006.01) | |
| *H01L 29/423* | (2006.01) | |

(52) U.S. Cl.
CPC ........ *H01L 29/7835* (2013.01); *H01L 29/402* (2013.01); *H01L 29/404* (2013.01); *H01L 29/407* (2013.01); *H01L 29/408* (2013.01); *H01L 29/78648* (2013.01); *H01L 21/761* (2013.01); *H01L 21/76224* (2013.01); *H01L 29/0696* (2013.01); *H01L 29/4238* (2013.01)

(58) Field of Classification Search
USPC ......................................................... 716/104
See application file for complete search history.

(56) References Cited

U.S. PATENT DOCUMENTS

| | | | |
|---|---|---|---|
| 6,110,804 A | 8/2000 | Parthasarathy et al. | |
| 7,405,443 B1 | 7/2008 | Zuniga et al. | |
| 8,564,057 B1 | 10/2013 | Darwish et al. | |
| 9,515,644 B2 | 12/2016 | Dinh et al. | |
| 2002/0135019 A1 | 9/2002 | Noda | |
| 2005/0138507 A1 | 6/2005 | Kurokawa | |
| 2005/0253170 A1 | 11/2005 | Akiyama | |
| 2010/0140715 A1 | 6/2010 | Nakamura et al. | |
| 2011/0241113 A1 | 10/2011 | Zuniga | |

(Continued)

FOREIGN PATENT DOCUMENTS

EP 2720270 A1 4/2014

OTHER PUBLICATIONS

Combined Search and Examination Report, UKIPO, Application No. GB1718592.7, dated May 11, 2018.

(Continued)

*Primary Examiner* — Bryce M Aisaka
(74) *Attorney, Agent, or Firm* — Jackson Walker L.L.P.

(57) ABSTRACT

A dual-gate metal-oxide-semiconductor field-effect transistor (MOSFET) may include a MOSFET having a channel region, a drain, and a source, a first gate formed proximate to the channel region, a drain extension region formed proximate to the drain, and a second gate formed proximate to the drain extension region.

46 Claims, 9 Drawing Sheets

(56) References Cited

U.S. PATENT DOCUMENTS

| | | | |
|---|---|---|---|
| 2014/0264581 A1* | 9/2014 | Chan | H01L 29/42368 |
| | | | 257/339 |
| 2014/0347131 A1 | 11/2014 | Dinh et al. | |
| 2015/0206961 A1 | 7/2015 | Adkisson et al. | |
| 2016/0087062 A1* | 3/2016 | Yin | H01L 29/4916 |
| | | | 257/344 |
| 2016/0149007 A1 | 5/2016 | Chou et al. | |
| 2016/0276428 A1 | 9/2016 | Faul et al. | |

OTHER PUBLICATIONS

International Search Report and Written Opinion of the International Searching Authority, International Application No. PCT/US2018/052012, dated Mar. 15, 2019.

* cited by examiner

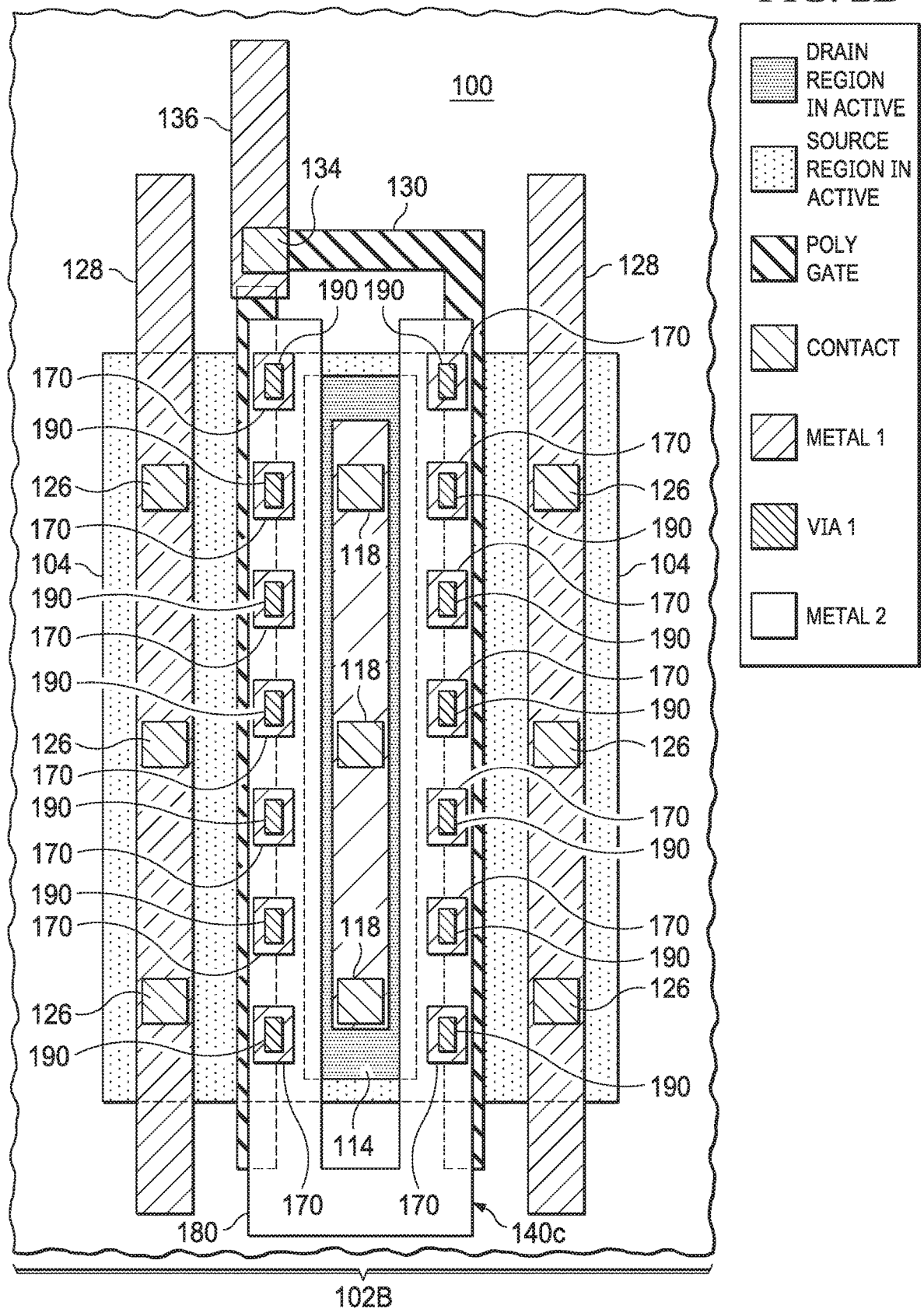

DUAL GATE METAL-OXIDE-SEMICONDUCTOR FIELD-EFFECT TRANSISTOR

FIELD OF DISCLOSURE

The present disclosure relates in general to semiconductor fabrication, and more particularly, to fabrication of and use of a dual-gate metal-oxide-semiconductor field-effect transistor.

BACKGROUND

Semiconductor device fabrication is a process used to create integrated circuits that are present in many electrical and electronic devices. It is a multiple-step sequence of photolithographic, mechanical, and chemical processing steps during which electronic circuits are gradually created on a wafer made of semiconducting material. For example, during semiconductor device fabrication, numerous discrete circuit components, including transistors, resistors, capacitors, inductors, and diodes may be formed on a single semiconductor die.

A transistor is a semiconductor device with many uses. Generally speaking, a transistor is a semiconductor device used to amplify or switch electronic signals and electrical power. It is composed of semiconductor material usually with at least three terminals for connection to an external circuit. Typically, a voltage or current applied to one pair of the transistor's terminals controls the current through another pair of terminals. One common type of transistor is a metal-oxide-semiconductor field-effect transistor (MOSFET). A typical MOSFET comprises an insulated gate, whose voltage determines the conductivity of the device as seen between two other non-gate terminals of the device, known as a drain terminal and source terminal. The MOSFET's ability to change conductivity with the amount of applied voltage allows it to be used for amplifying or switching electronic signals.

A type of MOSFET seeing increased use is an extended-drain MOSFET, sometimes referred to a drain-extended MOSFET, EDMOS, or DEMOS. An extended-drain MOSFET, as implied by its name, extends the drain of a transistor device by adding an n-type drain drift region between the drain and the channel of the transistor device, which may trap a majority of the electric field in this extended-drain region instead of the channel region, therefore containing hot carrier effects to this extended-drain region, instead of the channel region, therefore increasing hot carrier reliability of the transistor device. Existing extended-drain MOSFET devices often present a tradeoff between their drain-to-source ($V_{ds}$) breakdown voltages and their on resistance ($R_{dson}$). Accordingly, MOSFET devices that reduce such tradeoff are desired.

SUMMARY

In accordance with the teachings of the present disclosure, certain disadvantages and problems associated with extended-drain MOSFETs may be reduced or eliminated.

In accordance with embodiments of the present disclosure, a dual-gate metal-oxide-semiconductor field-effect transistor (MOSFET) may include a MOSFET having a channel region, a drain, and a source, a first gate formed proximate to the channel region, a drain extension region formed proximate to the drain, and a second gate formed proximate to the drain extension region.

In accordance with these and other embodiments of the present disclosure, a method for fabricating a dual-gate metal-oxide-semiconductor field-effect transistor (MOSFET) may include forming a MOSFET having a channel region, a drain, and a source, forming a first gate proximate to the channel region, forming a drain extension region proximate to the drain, and forming a second gate proximate to the drain extension region.

In accordance with these and other embodiments of the present disclosure, a method for operating a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region is provided. The method may include applying a first voltage to the first gate in order to modulate conduction of the dual-gate MOSFET and applying a second voltage to the second gate in order to modulate at least one of a breakdown voltage of the dual-gate MOSFET and a drain-to-source resistance of the dual-gate MOSFET.

In accordance with these and other embodiments of the present disclosure, a computer program product for implementing a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region, may be provided. The computer program product may include a computer usable medium having computer readable code physically embodied therein, said computer program product further comprising computer readable program code for describing the dual-gate MOSFET as a single MOSFET device which is operable to two different states based on a toggling variable.

In accordance with these and other embodiments of the present disclosure, an integrated circuit design system for synthesizing an integrated circuit design may include a processor and a memory device coupled to the processor, wherein the memory device stores a plurality of instructions that when executed by the processor provides at least one software module that includes a logic synthesizer module that receives a circuit description and a cell technology file to generate functional logic of the integrated circuit design. The cell technology file may include a characterization of a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region, that further describes the dual-gate MOSFET as a single MOSFET device which is operable to two different states based on a toggling variable. The logic synthesizer module may generate the functional logic of the integrated circuit including the dual-gate MOSFET.

In accordance with these and other embodiments of the present disclosure, a method for synthesizing an integrated circuit design may include storing in a memory device a plurality of instructions, executing, by a processor, the plurality of instructions to provide at least one software module that includes a logic synthesizer module, receiving, by the logic synthesizer module, a circuit description and a cell technology file; generating, by the logic synthesizer module, functional logic of the integrated circuit design, characterizing, within the cell technology file, a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region, wherein applying a first voltage to the first gate in order to modulate conduction of the dual-gate MOSFET, in which the dual-gate MOSFET is described as a single MOSFET device which is operable to two different states based on a toggling variable, and generating, by the logic synthesizer module, the functional logic of the integrated circuit including the dual-gate MOSFET.

In accordance with these and other embodiments of the present disclosure, a computer program product for synthesizing an integrated circuit design may include a computer usable medium having computer readable code physically embodied therein, said computer program product further comprising computer readable program code for: storing in a memory device a plurality of instructions; executing, by a processor, the plurality of instructions to provide at least one software module that includes a logic synthesizer module; receiving, by the logic synthesizer module, a circuit description and a cell technology file; generating, by the logic synthesizer module, functional logic of the integrated circuit design; characterizing, within the cell technology file, a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region, in which the dual-gate MOSFET is described as a single MOSFET device which is operable to two different states based on a toggling variable; and generating, by the logic synthesizer module, the functional logic of the integrated circuit including the dual-gate MOSFET.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 2B illustrates an alternative plan view of a portion of a semiconductor substrate depicting selected components of the dual-gate extended-drain MOSFET shown in FIG. 1A, in accordance with embodiments of the present disclosure;

DETAILED DESCRIPTION

Figure 1A:
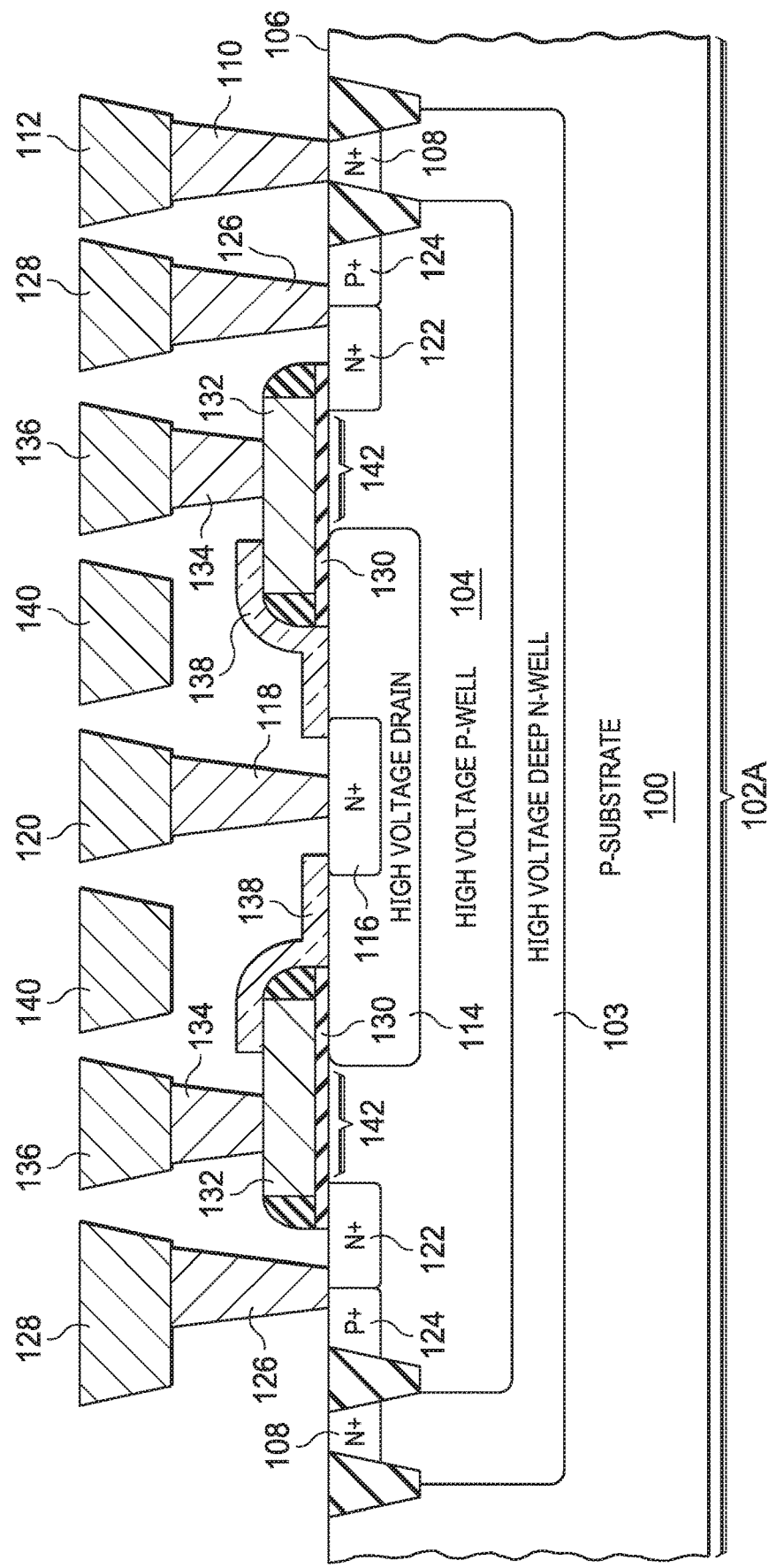
FIG. 1A illustrates an elevation view of a portion of a semiconductor substrate with a dual-gate extended-drain MOSFET fabricated thereon, in accordance with embodiments of the present disclosure.
Figure 2A:
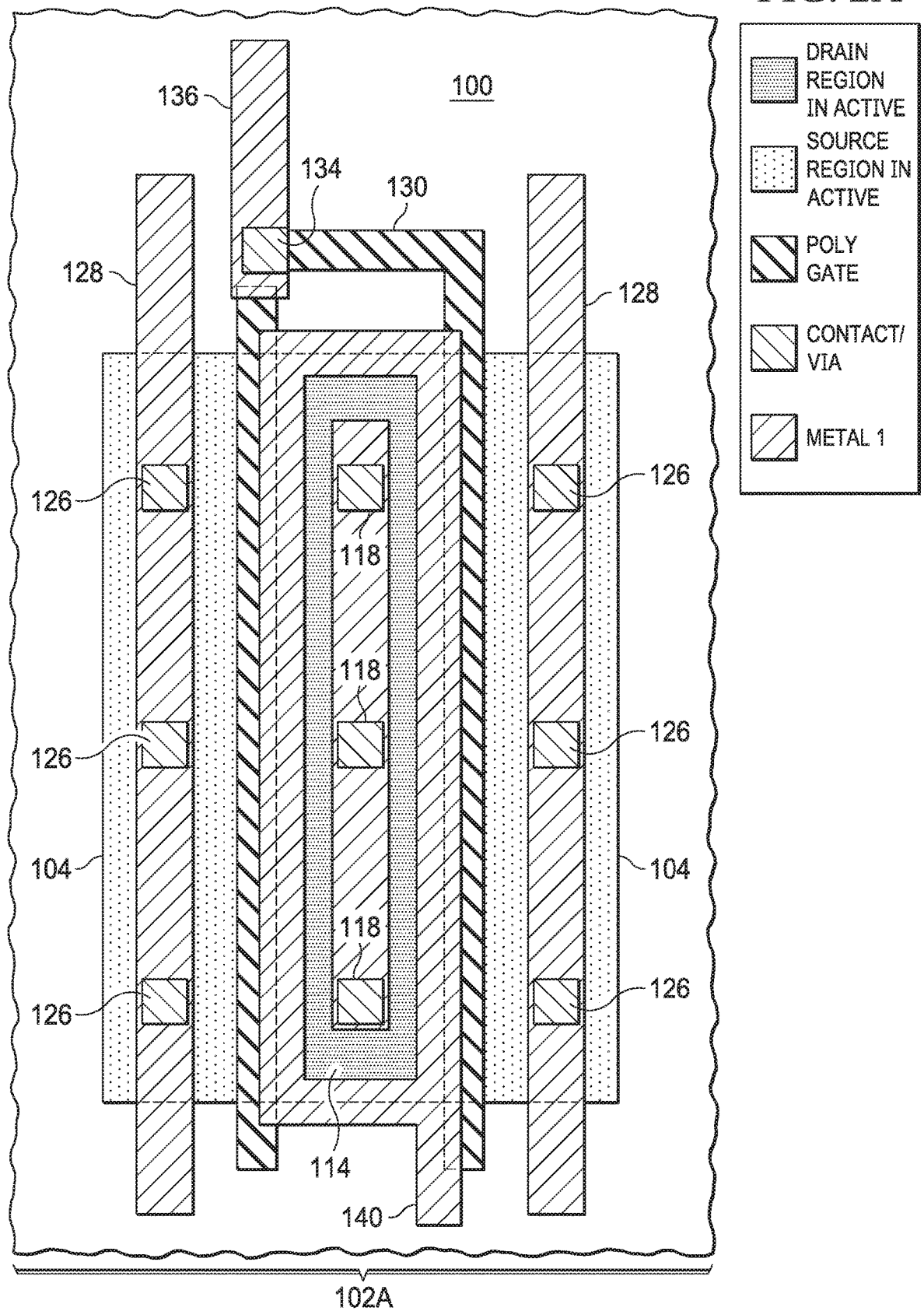
FIG. 2A illustrates a plan view of a portion of a semiconductor substrate depicting selected components of the dual-gate extended-drain MOSFET shown in FIG. 1A, in accordance with embodiments of the present disclosure.

FIG. 1A illustrates an elevation view of a portion of a semiconductor substrate 100 with a dual-gate extended-drain MOSFET 102A fabricated thereon, in accordance with embodiments of the present disclosure. FIG. 2A illustrates a plan view of a portion of a semiconductor substrate 100 depicting selected components of dual-gate extended-drain MOSFET 102A shown in FIG. 1A, in accordance with embodiments of the present disclosure. Dual-gate extended-drain MOSFET 102A may be formed upon any suitable semiconductor substrate, including without limitation silicon, silicon carbide, germanium, gallium phosphide, gallium nitride, gallium arsenide, indium phosphide, indium nitride, indium arsenide, etc. FIG. 1A illustrates an embodiment in which dual-gate extended-drain MOSFET 102A comprises an n-type MOSFET. Those of skill in the art will recognize from this disclosure how to implement a p-type MOSFET analogous to dual-gate extended-drain MOSFET 102A by applying principles of duality.

As shown in FIG. 1A, semiconductor substrate 100 may comprise a p-type substrate, as is known in the art. Implanted within semiconductor substrate 100 may be a high-voltage deep n-type well 103 between a high-voltage deep p-type well 104. High-voltage deep n-type well 103 may extend to a surface 106 of semiconductor substrate 100 where it may include one or more highly-doped n+ regions 108, one or both of which may be electrically coupled to a via 110 (e.g., formed with tungsten or other conductive metal) interfaced between a highly-doped n+ region 108 and an isolation terminal 112 formed in a metallization layer (e.g., copper, silver, aluminum, or other conductive metal) of dual-gate extended-drain MOSFET 102A.

Also as shown in FIG. 1A, dual-gate extended-drain MOSFET 102A may include a drain extension region 114 of n-type semiconductor with a highly-doped n-type drain drift region 116 at surface 106 of semiconductor substrate 100. N-type drain drift region 116 may be electrically coupled to a via 118 (e.g., formed with tungsten or other conductive metal) and interfaced between a highly-doped n-type drain drift region 116 and a drain terminal 120 of dual-gate extended-drain MOSFET 102A formed in a metallization layer (e.g., copper, silver, aluminum, or other conductive metal) of dual-gate extended-drain MOSFET 102A.

High-voltage deep p-type well 104 may also include a highly-doped n+ region 122 and a highly-doped p+ region 124 proximate to surface 106. N+ region 122 and p+ region 124 may be electrically coupled to a via 126 (e.g., formed with tungsten or other conductive metal) interfaced between n+ region 122/p+ region 124 on the one hand and a source/body terminal 128 formed in a metallization layer (e.g., copper, silver, aluminum, or other conductive metal) on the other hand.

Dual-gate extended-drain MOSFET 102A may include a gate oxide 130 (e.g., a semiconductor oxide) which may be formed on surface 106 over a channel region 142 comprising an area of high-voltage deep n-type well 103 proximate to surface 106, with such gate oxide 130 extending over a portion of n+ region 122, high-voltage drain extension region 114, and a portion of n-type drain drift region 116 of such dual-gate extended-drain MOSFET 102A. Gate oxide 130 may have gate 132 formed thereon. Gate 132 may be formed with a polycrystalline semiconductor. Gate 132 may be electrically coupled to a respective via 134 (e.g., formed with tungsten or other conductive metal) interfaced between gate 132 and a gate terminal 136 formed in a metallization layer (e.g., copper, silver, aluminum, or other conductive metal).

Dual-gate extended-drain MOSFET 102A may include a salicide block 138 formed over portions of gate 132, high-voltage drain extension region 114 otherwise exposed at surface 106, and a portion of n-type drain drift region 116 of dual-gate extended-drain MOSFET 102A. Salicide block 138 may serve to, during the fabrication process, prevent salicidation of surface 106 in areas not covered with salicide block 138.

Dual-gate extended-drain MOSFET 102A may also include a field plate 140 formed over salicide block 138 (and formed over high-voltage drain extension region 114) but which is not electrically coupled to surface 106 of semiconductor substrate 100. Instead, field plate 140 may be separated from salicide block 138 and surface 106 by a suitable dielectric material (e.g., a semiconductor oxide) used to provide mechanical support and electrical isolation of conductive components of dual-gate extended-drain MOSFET 102A. Accordingly, field plate 140 may act as a second gate in addition to gate 132, as described above.

As shown in FIG. 2A, a layout of the second gate implemented by field plate 140 may enclose the drain contact region (e.g., including drain terminal 120 and via 118) in order to form the second gate.

In operation, dual-gate extended-drain MOSFET 102A may operate in a manner similar to a traditional extended-drain MOSFET, in that the "traditional" polycrystalline semiconductor gate 132 may modulate conduction of channel region 142. However, one distinctive feature of dual-gate extended-drain MOSFET 102A is the second gate structure implemented with field plate 140. In some embodiments, in a non-conductive state of dual-gate extended-drain MOSFET 102A, for example when a gate-to-source voltage $V_{gs}$ of dual-gate extended-drain MOSFET 102A is less than a threshold voltage (e.g., approximately zero), the second gate implemented by field plate 140 may be set at a first voltage $V_{off}$ which in some embodiments, may be set approximately equal to gate-to-source voltage $V_{gs}$, or may be set approximately equal to zero relative to the source voltage. Such use of field plate 140 may extend a depletion zone of dual-gate extended-drain MOSFET 102A in the non-conductive state, thus reducing the maximum electric field at the drain-to-body junction of dual-gate extended-drain MOSFET 102A, thus increasing the breakdown voltage of dual-gate extended-drain MOSFET 102A.

In these and other embodiments, in a conductive state of dual-gate extended-drain MOSFET 102A, for example when a gate-to-source voltage $V_{gs}$ of dual-gate extended-drain MOSFET 102A is greater than a threshold voltage (e.g., a maximum rail voltage of the circuit using dual-gate extended-drain MOSFET 102A), the second gate implemented by field plate 140 may be set at a second voltage $V_{on}$, which in some embodiments, may be set approximately equal to gate-to-source voltage $V_{gs}$, or may be set approximately equal to a maximum rail voltage of the circuit using dual-gate extended-drain MOSFET 102A. Such use of field plate 140 may extend a depletion zone of dual-gate extended-drain MOSFET 102A in the non-conductive state, thus reducing serial impedance of drain extension region 114 in the conductive state, thus reducing the conductive state drain-to-source resistance $R_{dson}$ of dual-gate extended-drain MOSFET 102A, leading to lower conduction power losses. Thus, variable biasing of the second gate implemented by field plate 140 may enable a large breakdown voltage in the non-conductive state and a low conductive state drain-to-source resistance $R_{dson}$ as compared with existing approaches, all the while leveraging an existing metal layer in the semiconductor fabrication process, thus adding little or no cost to the fabrication process as compared to fabrication of existing extended-drain MOSFET devices. In addition, in some embodiments, operation of field plate 140 may promote release of charge previously trapped in dielectric material above drain extension region 114 that may occur during normal operation of dual-gate extended-drain MOSFET 102A. Such release of trapped charge may improve noise performance of dual-gate extended-drain MOSFET 102A (e.g., enhancement of 1/f or "pink" noise) and/or increase lifetime of dual-gate extended-drain MOSFET 102A as compared with existing approaches.

In some embodiments, field plate 140 may be operated to locally trap charges into a dielectric region near the periphery of gate 132 in order to modulate a breakdown voltage of and/or a conduction-state drain-to-source resistance of dual-gate extended-drain MOSFET 102A.

Figure 1B:
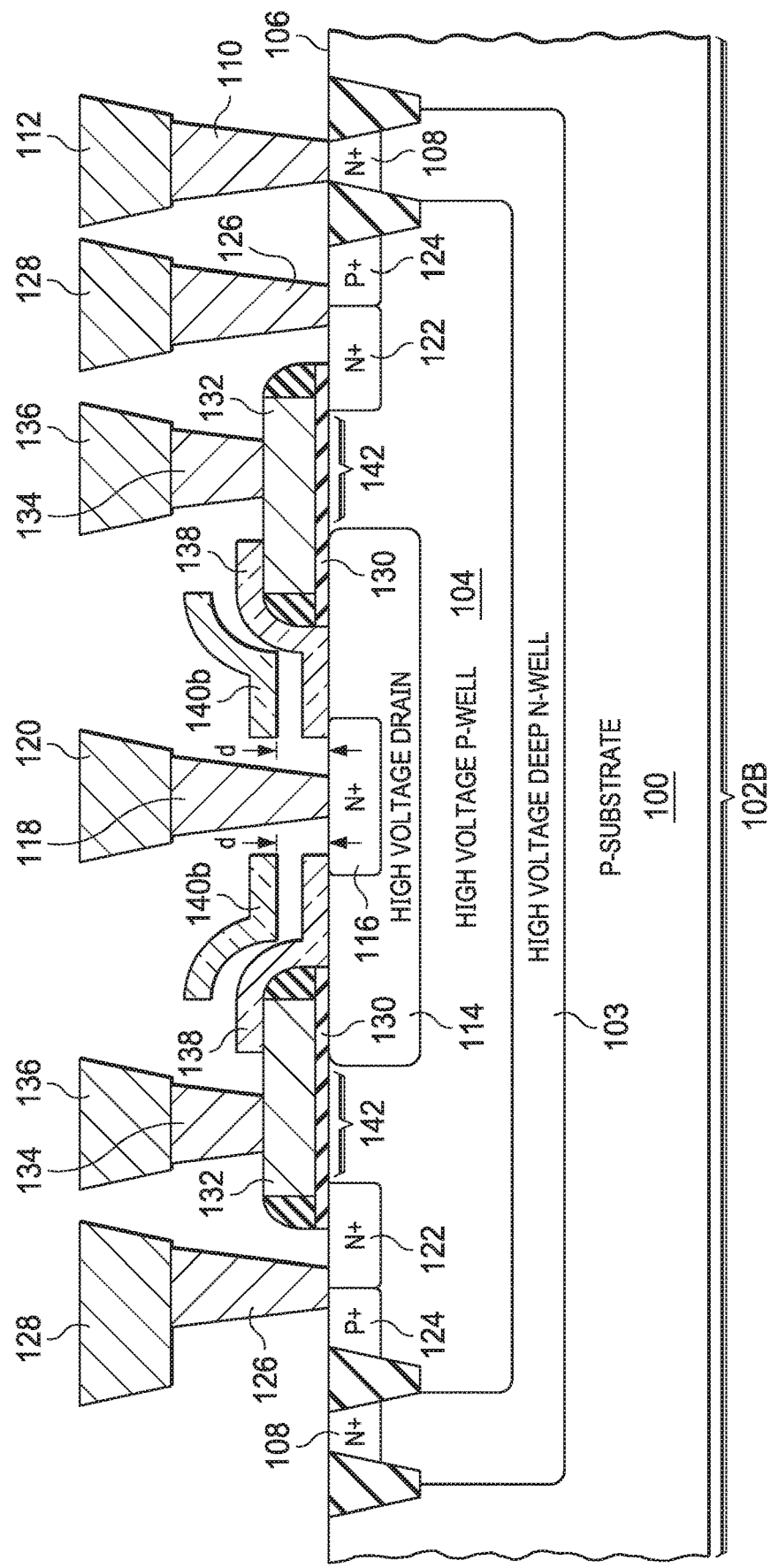
FIG. 1B illustrates an elevation view of a portion of another semiconductor substrate with a dual-gate extended-drain MOSFET fabricated thereon, in accordance with embodiments of the present disclosure.

Although the foregoing discussion contemplates that field plate 140 may be separated from drain extension region 114 by a semiconductor oxide or other dielectric material, in some embodiments, an isolated conducting layer may be placed between field plate 140 and drain extension region 114 in lieu of all or part of the semiconductor oxide or other dielectric material. The internal voltage of such isolated conducting layer could be set by capacitive coupling of a voltage applied to field plate 140, or by injecting charge into such isolated conducting layer through a high electric field during product testing or characterization, or during normal operation of dual-gate extended-drain n-MOSFET 102A. Inclusion of such isolation region may enhance the increase in breakdown voltage and decrease of conduction-state drain-to-source resistance compared to exclusion of such isolation region. In these and other embodiments, a location of field plate 140 and/or such isolated conducting layer relative to surface 106 may be selected to achieve desired performance with respect to breakdown voltage and/or conduction-state drain-to-source resistance. For example, FIG. 1B depicts a dual-gate extended-drain MOSFET 102B similar in structure and operation to dual-gate extended-drain MOSFET 102A, with the exception of including field plate 140b in lieu of field plate 140 of MOSFET 102A of FIG. 1A. In MOSFET 102B, field plate 140b may be formed in proximity to surface 106 at a distance d, wherein distance d may be selected to achieve desired performance with respect to breakdown voltage and/or conduction-state drain-to-source resistance.

Figure 1C:
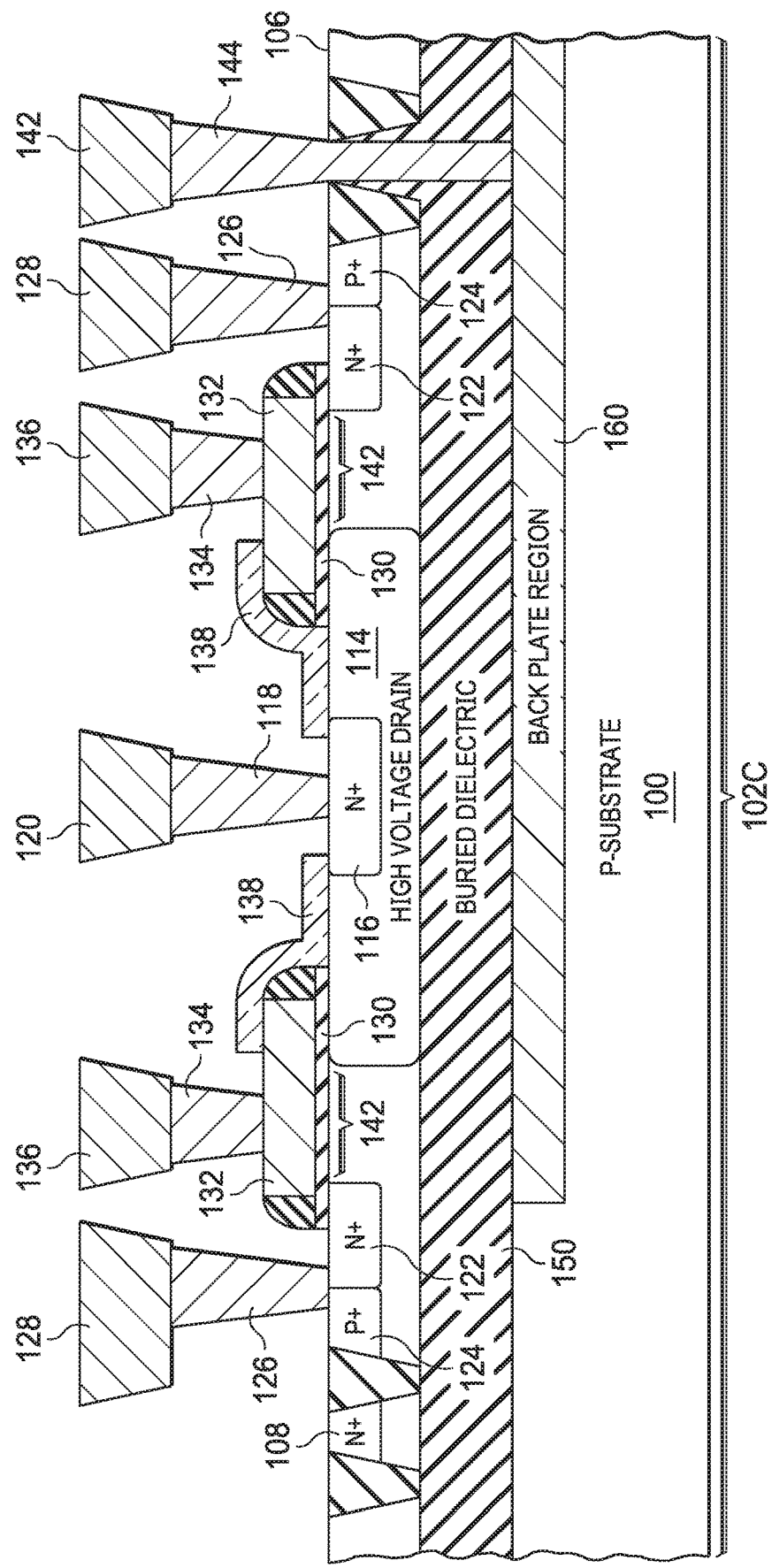
FIG. 1C illustrates an elevation view of a portion of another semiconductor substrate with a dual-gate extended-drain MOSFET fabricated thereon, in accordance with embodiments of the present disclosure.

In some embodiments, rather than being formed in a metal layer above surface 106 of semiconductor substrate 100, a field plate or a component similar in structure and/or function to field plate 140 may be placed below drain extension region 114. For example, a field plate may be formed on the back-side of a silicon-on-insulator device. As an illustrative example, For example, FIG. 1C depicts a dual-gate extended-drain MOSFET 102C similar in structure and operation to dual-gate extended-drain MOSFET 102A, with the exceptions that a buried dielectric 150 may replace high-voltage p-type well 104 of dual-gate extended-drain MOSFET 102A, and back plate region 160 may be present in lieu of high-voltage deep n-type well 103 of dual-gate extended-drain MOSFET 102A. Further, field plate 140 may not be present as it is in dual-gate extended-drain MOSFET 102A of FIG. 1, and instead, highly-doped n+ region 108, via 110, and isolation terminal 112 may be replaced with second gate contact 142 and via 144. In the embodiments represented by FIG. 1C, back plate region 160 may operate analogously to field plate of MOSFET 102A in order to control breakdown voltage and/or conduction-state drain-to-source resistance.

Although FIG. 2A depicts a particular example device layout for dual-gate extended-drain MOSFET 102A, in some embodiments, physical layout of field plate 140 may be optimized by using a large edge-to-area ratio in order to increase an effective electric field for a given supply voltage. For example, field plate 140 may be formed using a plurality of rectangular metal tiles, as opposed to a single contiguous, uniform structure. As an illustrative example, FIG. 2B depicts an example device layout for a dual-gate extended-drain MOSFET 102D which may be similar in structure and function to dual-gate extended-drain MOSFET 102A depicted in FIGS. 1A and 2A, except that in lieu of field plate 140, dual-gate extended-drain MOSFET 102D includes a field plate 140c implemented using a plurality of tiles 170 formed in one metallization layer coupled to one another by a conductive trace 180 of another metallization layer, wherein vias 190 coupled tiles 170 to conductive trace 180.

Figure 3:
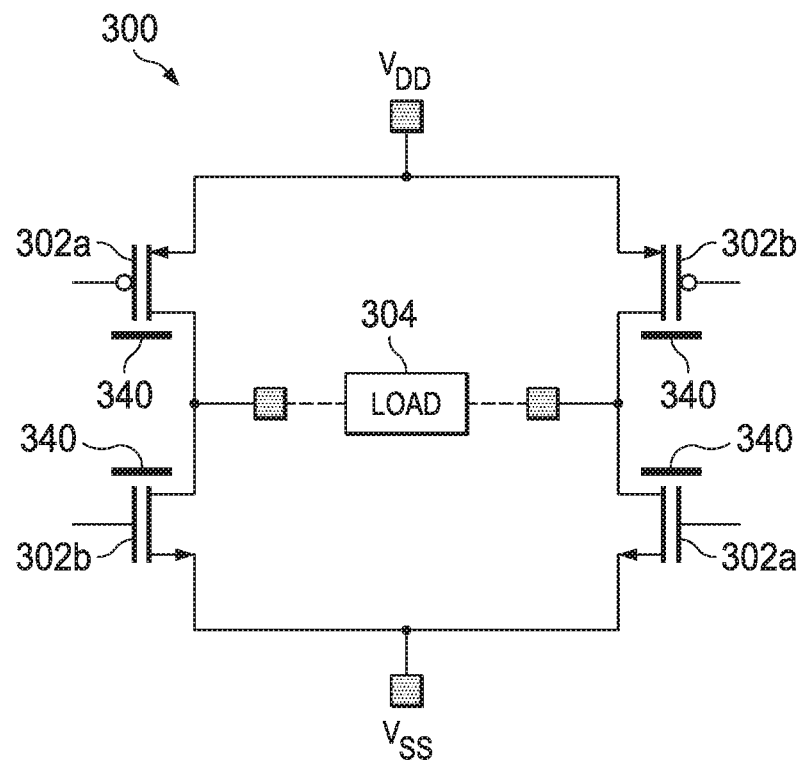
FIG. 3 illustrates a circuit diagram of an H-bridge switch including dual-gate extended-drain MOSFETs, in accordance with embodiments of the present disclosure.

The functionality of a dual-gate extended-drain MOSFET 102 ("dual-gate extended drain MOSFET 102" may generally refer to any or all of dual-gate extended-drain MOSFETs 102A, 102B, and 102C) may be further illustrated by reference to FIGS. 3-5. FIG. 3 illustrates a circuit diagram of an H-bridge switch 300 including dual-gate extended-drain p-MOSFETs 302a and dual-gate extended n-MOSFETs 302b, all having second gates 340 implemented with a field plate 140 as shown in FIG. 1A, in accordance with embodiments of the present disclosure. As known in the art, operation of H-bridge switch 300 may include a first phase in which dual-gate extended-drain MOSFETs 302 are activated such that current is of a first polarity through load 304 in the first phase and a second phase in which dual-gate extended-drain MOSFETs 302 are activated such that current is of a second polarity through load 304 in the second phase. Voltages $V_{DD}$ and $V_{SS}$ labeled in FIG. 3 are of two opposite voltage rails for powering H-bridge switch 300.

Figure 4:
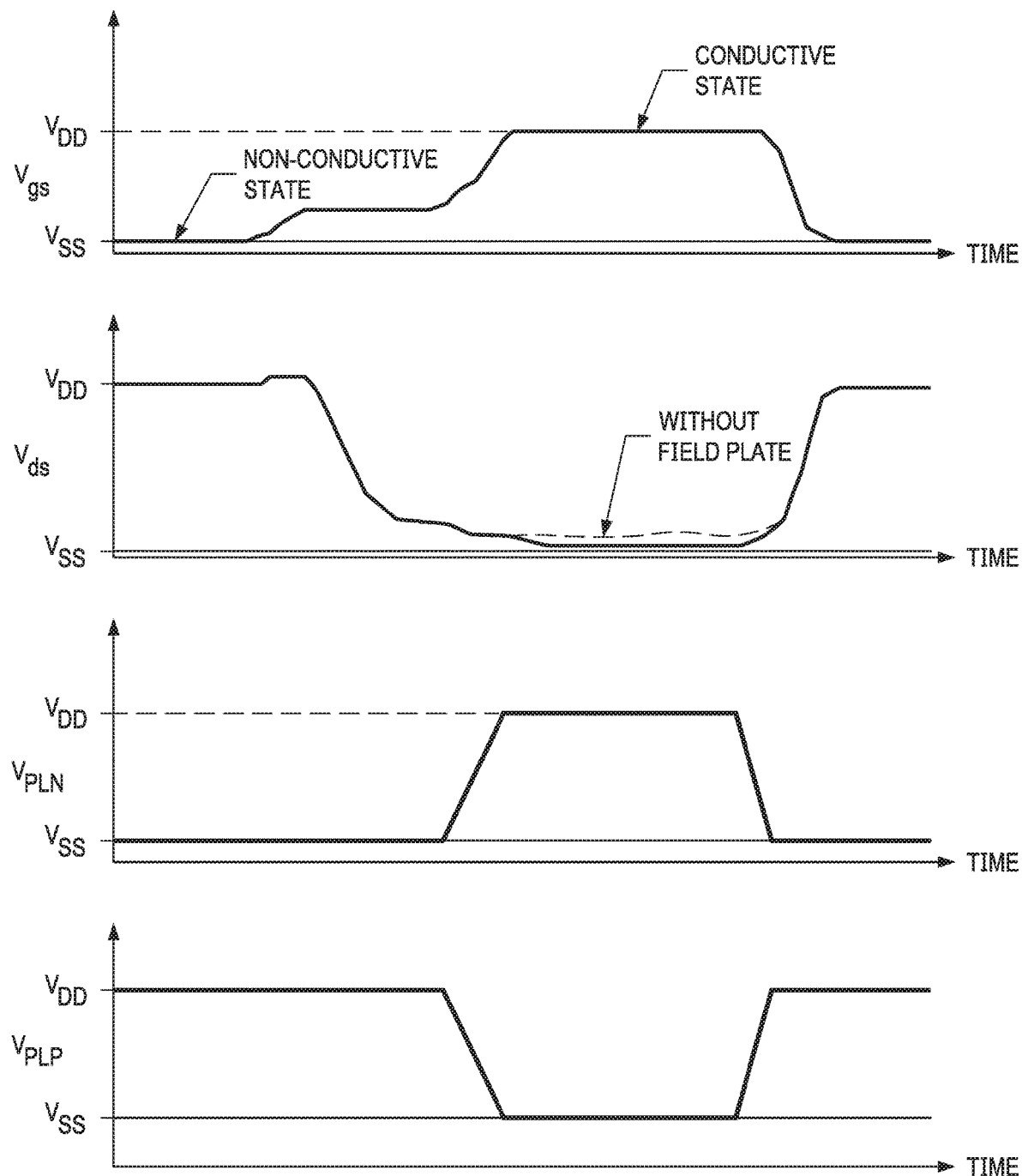
FIG. 4 illustrates example waveforms of selected voltages of a dual-gate extended-drain n-MOSFET during switching of the H-bridge switch depicted in FIG. 3, in accordance with embodiments of the present disclosure.

FIG. 4 illustrates example waveforms of selected voltages of a dual-gate extended-drain n-MOSFET 302b during switching of the H-bridge switch 300 depicted in FIG. 3, in accordance with embodiments of the present disclosure. Depicted from top to bottom in FIG. 4 are a graph depicting an example waveform of a gate-to-source voltage $V_{gs}$ versus time of a dual-gate extended-drain n-MOSFET 302b switching from a non-conductive state to a conductive state, a graph depicting an example waveform of a drain-to-source voltage $V_{ds}$ versus time of a dual-gate extended-drain n-MOSFET 302b switching from a non-conductive state to a conductive state, a graph depicting an example waveform of a field plate voltage $V_{PLN}$ versus time of a dual-gate extended-drain n-MOSFET 302b switching from a non-conductive state to a conductive state, and a graph depicting an example waveform of a field plate voltage $V_{PLP}$ versus time of a dual-gate extended-drain p-MOSFET 302a (complementary to the dual-gate extended-drain n-MOSFET 302b) switching from a non-conductive state to a conductive state. Also depicted in the graph of drain-to-source voltage $V_{ds}$ versus time of a dual-gate extended-drain n-MOSFET 302b is a dotted line depicting drain-to-source voltage $V_{ds}$ versus time in the absence of second gate 340, showing that inclusion of second gate 340 may reduce conduction losses of dual-gate extended-drain n-MOSFET 302b as compared to existing approaches.

Figure 5:
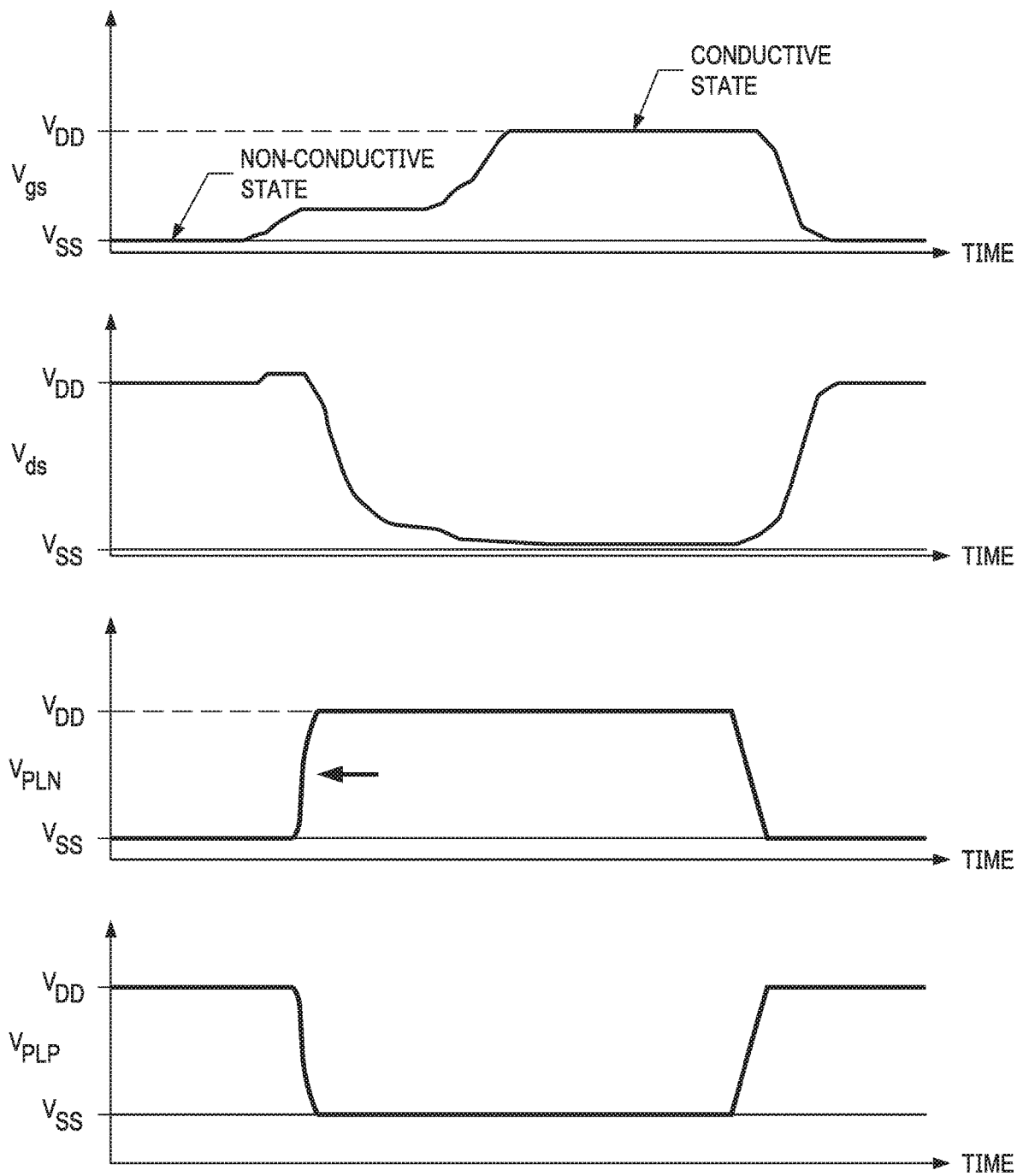
FIG. 5 illustrates example waveforms of selected voltages of a dual-gate extended-drain n-MOSFET during switching of the H-bridge switch depicted in FIG. 3, in accordance with embodiments of the present disclosure.

FIG. 5 illustrates other example waveforms of selected voltages of a dual-gate extended-drain n-MOSFET 302b during switching of the H-bridge switch 300 depicted in FIG. 3, in accordance with embodiments of the present disclosure. Depicted from top to bottom in FIG. 5 are a graph depicting an example waveform of a gate-to-source voltage $V_{gs}$ versus time of a dual-gate extended-drain n-MOSFET 302b switching from a non-conductive state to a conductive state, a graph depicting an example waveform of a drain-to-source voltage $V_{ds}$ versus time of a dual-gate extended-drain n-MOSFET 302b switching from a non-conductive state to a conductive state, a graph depicting an example waveform of a field plate voltage $V_{PLN}$ versus time of a dual-gate extended-drain n-MOSFET 302b switching from a non-conductive state to a conductive state, and a graph depicting an example waveform of a field plate voltage $V_{PLP}$ versus time of a dual-gate extended-drain p-MOSFET 302a (complementary to the dual-gate extended-drain n-MOSFET 302b) switching from a non-conductive state to a conductive state. One of the key differences between FIG. 5 and FIG. 4 is that in FIG. 5, field plate voltages $V_{PLN}$ and $V_{PLP}$ are switched at an earlier time $t_0$ than the time $t_1$ in which such voltages are switched in FIG. 4. Thus, as shown in the graph of drain-to-source voltage $V_{ds}$ versus time of a dual-gate extended-drain n-MOSFET 302b, switching of drain-to-source voltage $V_{ds}$ versus time may occur more quickly when field plate voltages $V_{PLN}$ and $V_{PLP}$ are switched at time $t_0$ as compared to when field plate voltages $V_{PLN}$ and $V_{PLP}$ are switched at time $t_1$ (shown in dotted line in the drain-to-source voltage $V_{ds}$ versus time graph in FIG. 5), showing that such earlier switching may accelerate the switching time and reduce switching losses of dual-gate extended-drain n-MOSFET 302b as compared to existing approaches.

While the dual-gate extended-drain MOSFET described above may improve device function, modeling (e.g., with Verilog or similar tools) of such a device for design, testing, and verification using existing approaches provides a disadvantage, as using existing approaches, two model files need to be used to define a dual-gate extended-drain MOSFET with a variable field plate voltage. To improve modeling for design, testing, and verification, a new model for the dual-gate extended-drain MOSFET described above may be implemented which includes a toggling variable defined in order to describe a dual-gate extended-drain MOSFET as a single device which can operate at two different states. Set forth below is an example model file which describes a dual-gate extended-drain MOSFET as a single device which can operate at two different states.

```
module MOS_shifter(s, FP);
    inout s, FP;
    electrical s, FP;
    real bit, delta_vth0, delta_u0, delta_k1;
    analog begin
        // Initial state
        @(initial_step) bit=0;
        // Main routine
        if ( V(FP,s) > 2 ) begin           //
LowBV_LowRdson
            bit = -1;
        end
        else
            if ( V(s,FP) > 1.5 ) begin     //
HiBV_HiRdson
                bit =1;
            end
        // Shift voltage on the FP node to turn the channel
        under // the extended drain on and off
            if (bit == -1)
                begin
                    delta_vth0 = XXXX;
                    delta_u0 = XXXX;
                    delta_k1 = XXXX;
                end
            if (bit == 1)
                begin
                    delta_vth0 = XXXX;
                    delta_u0 = XXXX;
                    delta_k1 = XXXX;
                end
    end
endmodule
```

Figure 6:
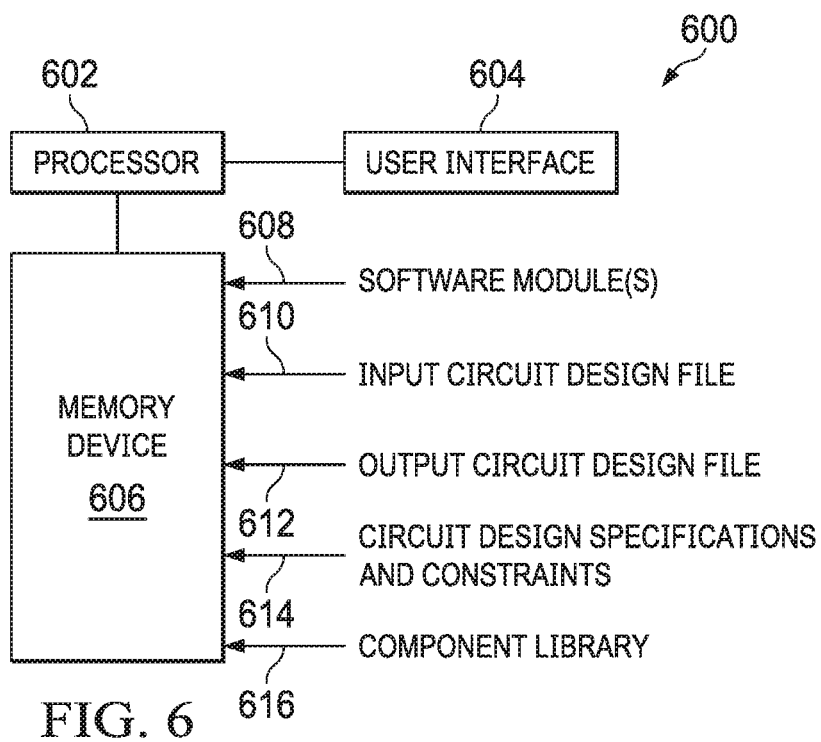
FIG. 6 illustrates a block diagram of an example circuit design system, in accordance with embodiments of the present disclosure.

FIG. 6 illustrates a block diagram of an example circuit design system 600, in accordance with embodiments of the present disclosure. Circuit design system 600 may be capable of receiving and synthesizing, analyzing, and/or optimizing an initial circuit design that includes dual-gate MOSFETs 102, 302a, and 302b. Circuit design system 600 may comprise any computing device, such as a computer that has a processor 602, a user interface 604, and a memory device 606.

Processor 602 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 602 may interpret and/or execute program instructions and/or process data stored in memory device 606 and/or another component of circuit design system 600.

Memory device 606 may be communicatively coupled to processor 602 and may include any system, device, or apparatus configured to retain program instructions and/or data for a period of time (e.g., computer-readable media). Memory device 606 may include random access memory (RAM), read-only memory (ROM), electrically erasable programmable read-only memory (EEPROM), flash memory, magnetic storage, opto-magnetic storage, or any suitable selection and/or array of volatile or non-volatile memory that retains data after power to circuit design system 600 is turned off. Memory device 606 may store different types of instructions and/or data, including, but not limited to software module(s) 608 including executable instructions that may be executed by processor 602 (e.g., circuit design synthesis, analysis and/or optimization tools) to control processor 602 in performing its various operations, an input circuit design file 610, an output circuit design file 612, circuit design specifications and constraints 614, a component library 616, and/or other data, information, or instructions. One or more of input circuit design file 610, circuit design specifications and constraints 614, and component library 616 may include data and information for defining dual-gate MOSFETs 102, 302a, and 302b.

User interface 604 may comprise any instrumentality or aggregation of instrumentalities by which a user may interact with circuit design system 600. For example, user interface 604 may permit a user to input data and/or instructions into circuit design system 600, and/or otherwise manipulate circuit design system 600 and its associated components (e.g., via keyboard, mouse, trackpad, or other pointing device). User interface 604 may also permit circuit design system 600 to communicate data to a user, e.g., by way of a display device.

Figure 7:
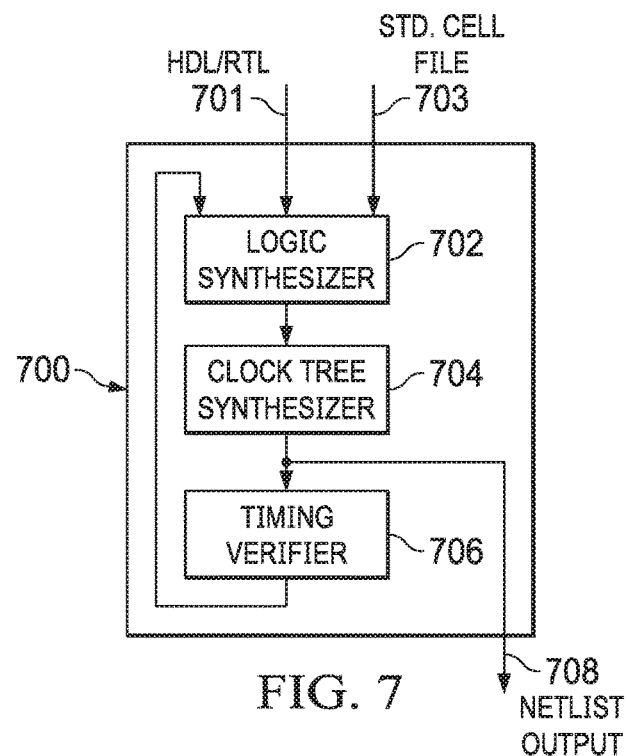
FIG. 7 illustrates a block diagram of a synthesis software tool, in accordance with embodiments of the present disclosure.

FIG. 7 illustrates a block diagram of a synthesis software tool 700, in accordance with embodiments of the present disclosure. Synthesis software tool 700 may be stored as computer-readable instructions in memory device 606 and readable and executable by the processor 602 of circuit design system 600. Synthesis software tool 700 may comprise a logic synthesizer module 702, a clock tree synthesizer module 704, and a timing verifier 706. Logic synthesizer module 702 may receive a high-level description language (HDL) or register transfer level (RTL) circuit description 701 and a standard cell technology file 703. Functional logic may be generated from standard cell technology file 703 by logic synthesizer module 702, including the various dual-gate MOSFETs 102, 302a, and/or 302b, so that the dual-gate MOSFETs 102, 302a, and/or 302b may each be respectively used in place of at least two flip flops (e.g., flip flops 100) that are in the data paths of the circuit description 701 in data paths of an integrated circuit. Standard cell technology file 703 may include data and information for characterizing dual-gate MOSFETs 102, 302a, and/or 302b as one or more standard cells. Clock tree synthesizer module 704 may generate clock tree paths in the integrated circuit from a clock source to the clock inputs of the various elements including the various dual-gate MOSFETs 102, 302a, and 302b in the data paths. The timing verifier module 706 may receive a netlist including data paths and clock tree paths of the integrated circuit design to verify that timing specifications are satisfied with the given logical design of the integrated circuit. Timing verifier module 706 may verify that the timing specifications of the logical design are in fact met to output a netlist 708. Netlist 708 may be sent to a foundry for manufacturing of the integrated circuit described by netlist 708.

Figure 8:
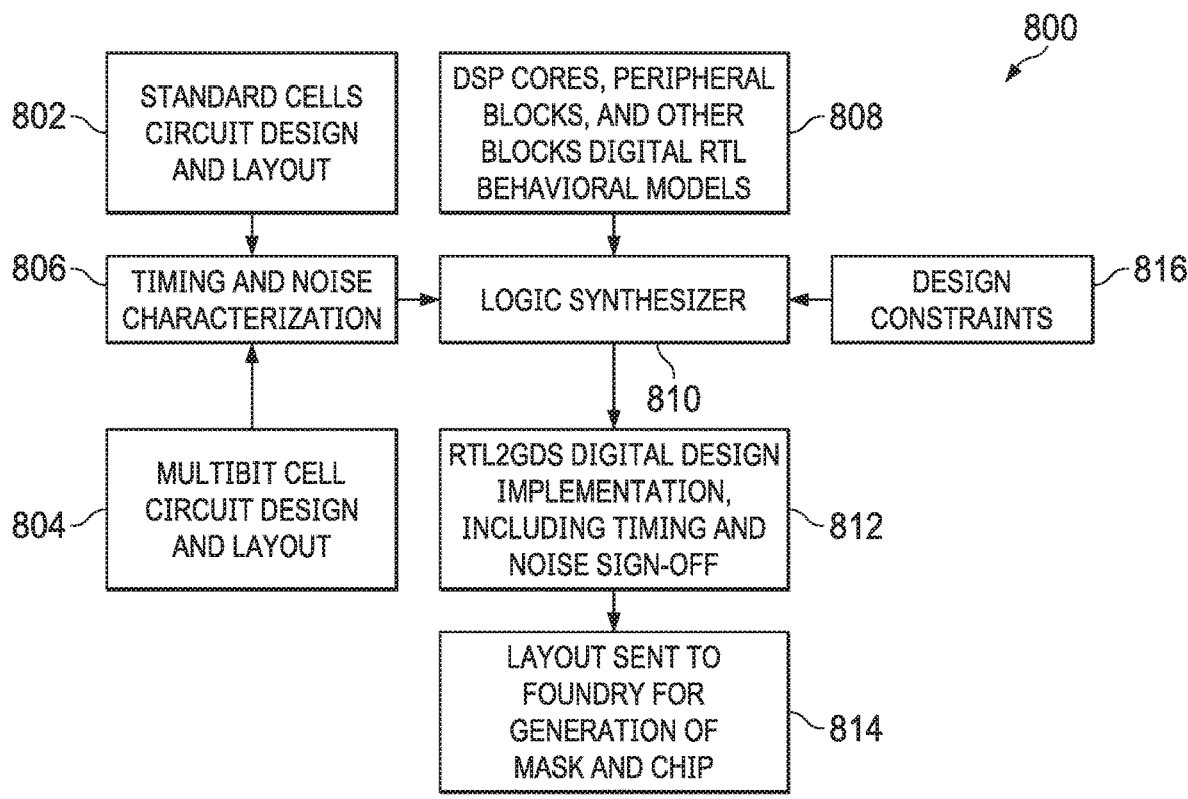
FIG. 8 illustrates a flow chart of an example method for synthesizing an integrated circuit design with multi-bit pulsed latch cells in accordance with the present disclosure.

FIG. 8 illustrates a flow chart of an example method 800 for synthesizing an integrated circuit design with dual-gate MOSFETs 102, 302a, and/or 302b, in accordance with the present disclosure. Method 800 may be embodied in instructions that are stored in memory device 606 of circuit design system 600 and read and executed by processor 602. For example, method 800 may be implemented by synthesis software tool 700. In accordance with method 800, at block 802, a standard cell circuit design and layout for an integrated circuit design may be provided to a timing and noise characterization block 806, and at block 804, multi-bit cell circuit design and layout for the integrated circuit design that incorporate dual-gate MOSFETs 102, 302a, and/or 302b in accordance with the present disclosure may also be provided to timing and noise characterization block 806. The timing and noise characterization block 806 may provide timing and noise characterizations of the integrated circuit design to logic synthesizer module 702 at logic synthesizer process block 810. Characterizations of the laid-out standard cells and the laid-out multi-bit cells (including dual-gate MOSFETs 102, 302a, and/or 302b) may also be provided to logic synthesizer module 702 at logic synthesizer process block 810. The digital RTL behavioral models of block 808 may be among the RTL circuit description 701 provided to logical synthesizer processor block 810. RTL behavioral models of block 808 may include but are not limited to digital signal processing (DSP) cores, peripheral blocks, and other blocks that may be digitally designed. Furthermore, the design constraints of block 816, that may include, without limitation, various parameters for characterizing dual-gate MOSFETs 102, 302a, and/or 302b, may also be provided to logic synthesizer process block 810. Within logic synthesizer process block 810, logic synthesizer 702 synthesizes the data and information relating to the laid-out standard cells, the laid-out multi-bit cells, the timing and noise characterizations, the various digital RTL behavioral models, and the design constraints to provide a physical design layout that results in an RTL to Graphic Data System ("GDS") digital design implementation at block 812. GDS is a format that may be used to control integrated circuit photomask plotting. The RTL-to-GDS digital design implementation includes at least the timing information and noise sign-off information. The GDS file containing the physical design layout information may be sent to a foundry for generation of a mask and the semiconductor chip at block 814.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A dual-gate metal-oxide-semiconductor field-effect transistor (MOSFET) comprising:
   a MOSFET having a channel region, a drain, and a source;
   a first gate formed proximate to the channel region;
   a drain extension region formed proximate to the drain; and
   a second gate formed proximate to the drain extension region and further in proximity to a surface of a semiconductor substrate upon which the dual-gate MOSFET is formed than the first gate.

2. The dual-gate MOSFET of claim 1, wherein the second gate is formed outside a surface of a semiconductor substrate upon which the first gate is formed.

3. The dual-gate MOSFET of claim 1, wherein the second gate is formed within the semiconductor substrate upon which the MOSFET is formed, such that the second gate is isolated from the drain extension region.

4. The dual-gate MOSFET of claim 1, further comprising an isolated conducting layer formed between the second gate and the drain extension region.

5. The dual-gate MOSFET of claim 4, wherein the isolated conducting layer is arranged such that its voltage is controlled via capacitive coupling with the second gate.

6. The dual-gate MOSFET of claim 4, wherein the isolated conducting layer includes charge injected during manufacture of the dual-gate MOSFET.

7. The dual-gate MOSFET of claim 4, wherein a proximity of the isolated conducting layer to a surface of a semiconductor substrate upon which the dual-gate MOSFET is formed is selected to achieve at least one of a desired breakdown voltage and a desired conductive state drain-to-source resistance of the dual-gate MOSFET.

8. The dual-gate MOSFET of claim 1, wherein the second gate is arranged such that during a conduction state of the dual-gate MOSFET, a voltage applied to the second gate reduces a conduction-state drain-to-source impedance of the dual-gate MOSFET relative to the conduction-state drain-to-source impedance in an absence of the second gate.

9. The dual-gate MOSFET of claim 1, wherein the second gate is arranged such that during a non-conduction state of the dual-gate MOSFET, a voltage applied to the second gate increases a breakdown voltage of the dual-gate MOSFET relative to the breakdown voltage in an absence of the second gate.

10. The dual-gate MOSFET of claim 1, wherein the second gate is arranged such that the second gate is operable to locally trap charges into a dielectric region proximate to the first gate in order to modulate at least one of a conduction of the drain extension region and a breakdown voltage of the dual-gate MOSFET.

11. The dual-gate MOSFET of claim 1, wherein a proximity of the second gate to a surface of a semiconductor substrate upon which the dual-gate MOSFET is formed is selected to achieve at least one of a desired breakdown voltage and a desired conductive state drain-to-source resistance of the dual-gate MOSFET.

12. The dual-gate MOSFET of claim 1, wherein the second gate is formed from a metallization layer of the dual-gate MOSFET further in proximity to a surface of a semiconductor substrate upon which the dual-gate MOSFET is formed than the first gate.

13. The dual gate MOSFET of claim 1, wherein a layout of the second gate encloses a drain contact region that is coupled to the drain in order to form the second gate.

14. The dual gate MOSFET of claim 1, wherein a layout of the second gate comprises a multiple number of tiles electrically coupled together to form the second gate.

15. A method for fabricating a dual-gate metal-oxide-semiconductor field-effect transistor (MOSFET) comprising:

forming a MOSFET having a channel region, a drain, and a source;

forming a first gate proximate to the channel region;

forming a drain extension region proximate to the drain; and forming a second gate proximate to the drain extension region and further in proximity to a surface of a semiconductor substrate upon which the dual-gate MOSFET is formed than the first gate.

16. The method of claim 15, further comprising forming the second gate outside a surface of a semiconductor substrate upon which the first gate is formed.

17. The method of claim 15, further comprising forming the second gate within the semiconductor substrate upon which the MOSFET is formed, such that the second gate is isolated from the drain extension region.

18. The method of claim 15, further comprising forming an isolated conducting layer between the second gate and the drain extension region.

19. The method of claim 18, further comprising arranging the isolated conducting layer such that its voltage is controlled via capacitive coupling with the second gate.

20. The method of claim 18, further comprising injecting charge into the isolated conducting layer during manufacture of the dual-gate MOSFET.

21. The method of claim 18, further comprising selecting a proximity of the isolated conducting layer to a surface of a semiconductor substrate upon which the dual-gate MOSFET is formed to achieve at least one of a desired breakdown voltage and a desired conductive state drain-to-source resistance of the dual-gate MOSFET.

22. The method of claim 15, further comprising arranging the second gate such that during a conduction state of the dual-gate MOSFET, a voltage applied to the second gate reduces a conduction-state drain-to-source impedance of the dual-gate MOSFET relative to the conduction-state drain-to-source impedance in an absence of the second gate.

23. The method of claim 15, further comprising arranging the second gate such that during a non-conduction state of the dual-gate MOSFET, a voltage applied to the second gate increases a breakdown voltage of the dual-gate MOSFET relative to the breakdown voltage in an absence of the second gate.

24. The method of claim 15, further comprising arranging the second gate such that the second gate is operable to locally trap charges into a dielectric region proximate to the first gate in order to modulate at least one of a conduction of the drain extension region and a breakdown voltage of the dual-gate MOSFET.

25. The method of claim 15, further comprising selecting a proximity of the second gate to a surface of a semiconductor substrate upon which the dual-gate MOSFET is formed to achieve at least one of a desired breakdown voltage and a desired conductive state drain-to-source resistance of the dual-gate MOSFET.

26. The method of claim 15, further comprising forming the second gate in a metallization layer of the dual-gate MOSFET further in proximity to a surface of a semiconductor substrate upon which the dual-gate MOSFET is formed than the first gate.

27. The method of claim 15, further comprising arranging a layout of the second gate encloses a drain contact region that is coupled to the drain in order to form the second gate.

28. The method of claim 15, further comprising arranging a layout of the second gate comprises a multiple number of tiles electrically coupled together to form the second gate.

29. A method for operating a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region, the method comprising:

applying a first voltage to the first gate in order to modulate conduction of the dual-gate MOSFET; and applying a second voltage to the second gate in order to modulate at least one of a breakdown voltage of the dual-gate MOSFET and a drain-to-source resistance of the dual-gate MOSFET.

30. The method of claim 29, further comprising controlling a voltage of an isolated conducting layer formed between the second gate and the drain extension region.

31. The method of claim 30, further comprising controlling the voltage of the isolated conducting layer via capacitive coupling with the second gate.

32. The method of claim 30, further comprising controlling the voltage of the isolated conducting layer by injecting charge during manufacture of the dual-gate MOSFET.

33. The method of claim 29, further comprising, during a conduction state of the dual-gate MOSFET, applying the second voltage to the second gate to reduce a conduction-state drain-to-source impedance of the dual-gate MOSFET relative to the conduction-state drain-to-source impedance in an absence of the second gate.

34. The method of claim 29, comprising, during a conduction state of the dual-gate MOSFET, applying the second voltage to the second gate to increase a breakdown voltage of the dual-gate MOSFET relative to the breakdown voltage in an absence of the second gate.

35. The method of claim 29, further comprising applying the second voltage to the second gate to locally trap charges into a dielectric region proximate to the first gate in order to modulate at least one of a conduction of the drain extension region and a breakdown voltage of the dual-gate MOSFET.

36. The method of claim 29, further comprising switching the second voltage relative to the first voltage when transitioning the dual-gate MOSFET between a non-conductive state and a conductive state of the dual-gate MOSFET in order to minimize switching power loss associated with the transitioning.

37. The method of claim 29, further comprising applying the second voltage to reduce conductive power loss associated with the dual-gate MOSFET.

38. The method of claim 29, further comprising applying the second voltage to release charge trapped in a dielectric material proximate to the drain extension region.

39. A computer program product for implementing a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region, the computer program product comprising a computer usable medium having computer readable code physically embodied therein, said computer program product further comprising computer readable program code for describing the dual-gate MOSFET as a single MOSFET device which is operable to two different states based on a toggling variable.

40. The computer program product of claim 39, wherein the computer readable code is further configured for:

applying a first voltage to the first gate in order to modulate conduction of the dual-gate MOSFET; and applying a second voltage to the second gate in order to modulate at least one of a breakdown voltage of the dual-gate MOSFET and a drain-to-source resistance of the dual-gate MOSFET, wherein the second voltage is indicative of the toggling variable.

41. An integrated circuit design system for synthesizing an integrated circuit design, comprising:
a processor; and
a memory device coupled to the processor, wherein the memory device stores a plurality of instructions that when executed by the processor provides at least one software module that includes:
a logic synthesizer module that receives a circuit description and a cell technology file to generate functional logic of the integrated circuit design;
wherein the cell technology file includes a characterization of a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region, that further describes the dual-gate MOSFET as a single MOSFET device which is operable to two different states based on a toggling variable; and
wherein the logic synthesizer module generates the functional logic of the integrated circuit design including the dual-gate MOSFET.

42. The integrated circuit design system of claim 41, wherein the characterization further describes the dual-gate MOSFET such that applying a first voltage to the first gate modulates conduction of the dual-gate MOSFET, and such that applying a second voltage to the second gate modulates at least one of a breakdown voltage of the dual-gate MOSFET and a drain-to-source resistance of the dual-gate MOSFET, wherein the second voltage is indicative of the toggling variable.

43. A method for synthesizing an integrated circuit design, comprising:
storing in a memory device a plurality of instructions;
executing, by a processor, the plurality of instructions to provide at least one software module that includes a logic synthesizer module;
receiving, by the logic synthesizer module, a circuit description and a cell technology file;
generating, by the logic synthesizer module, functional logic of the integrated circuit design;
characterizing, within the cell technology file, a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region, in which the dual-gate MOSFET is described as a single MOSFET device which is operable to two different states based on a toggling variable; and
generating, by the logic synthesizer module, the functional logic of the integrated circuit including the dual-gate MOSFET.

44. The method of claim 43, wherein characterizing further includes describing the dual-gate MOSFET such that applying a first voltage to the first gate modulates conduction of the dual-gate MOSFET, and such that applying a second voltage to the second gate modulates at least one of a breakdown voltage of the dual-gate MOSFET and a drain-to-source resistance of the dual-gate MOSFET, wherein the second voltage is indicative of the toggling variable.

45. A computer program product for synthesizing an integrated circuit design, the computer program product comprising a computer usable medium having computer readable code physically embodied therein, said computer program product further comprising computer readable program code for:
storing in a memory device a plurality of instructions;
executing, by a processor, the plurality of instructions to provide at least one software module that includes a logic synthesizer module;
receiving, by the logic synthesizer module, a circuit description and a cell technology file;
generating, by the logic synthesizer module, functional logic of the integrated circuit design;
characterizing, within the cell technology file, a dual-gate metal-oxide-semiconductor field-effect transistor (MOSFET) comprising a MOSFET having a channel region, a drain, and a source and further comprising a first gate formed proximate to the channel region, a drain extension region formed proximate to the drain, and a second gate formed proximate to the drain extension region, in which the dual-gate MOSFET is described as a single MOSFET device which is operable to two different states based on a toggling variable; and
generating, by the logic synthesizer module, the functional logic of the integrated circuit including the dual-gate MOSFET.

46. The computer program product of claim 45, wherein characterizing further includes describing the dual-gate MOSFET such that applying a first voltage to the first gate modulates conduction of the dual-gate MOSFET, and such that applying a second voltage to the second gate modulates at least one of a breakdown voltage of the dual-gate MOSFET and a drain-to-source resistance of the dual-gate MOSFET, wherein the second voltage is indicative of the toggling variable.

* * * * *